US007468331B2

United States Patent
(12) United States Patent
Huggins

(10) Patent No.: US 7,468,331 B2
(45) Date of Patent: Dec. 23, 2008

(54) ANGLED ELONGATED FEATURES FOR IMPROVED ALIGNMENT PROCESS INTEGRATION

(75) Inventor: Kevin Huggins, Hillsboro, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 11/961,932

(22) Filed: Dec. 20, 2007

(65) Prior Publication Data

US 2008/0092353 A1 Apr. 24, 2008

Related U.S. Application Data

(62) Division of application No. 10/875,065, filed on Jun. 23, 2004, now Pat. No. 7,315,087.

(51) Int. Cl.
*H01L 21/00* (2006.01)

(52) U.S. Cl. .............................. 438/800; 257/E21.001

(58) Field of Classification Search .......... 257/E21.001, 257/E23.179
See application file for complete search history.

(56) References Cited

U.S. PATENT DOCUMENTS 4,932,064 A 6/1990 Kasahara
6,504,254 B2 1/2003 Takizawa
2003/0101610 A1 6/2003 Yu et al.

*Primary Examiner*—Scott B Geyer
(74) *Attorney, Agent, or Firm*—Fish & Richardson P.C.

(57) ABSTRACT

Elongated features may be incorporated at least partially in an alignment region. The alignment region may be defined by a plurality of alignment features aligned along a first axis. A long axis of the elongated features may be neither parallel nor perpendicular to the first axis. The alignment region may further include another plurality of alignment features aligned a second axis that is not parallel to the first axis. The second axis may be neither parallel to or perpendicular to the long axis.

27 Claims, 11 Drawing Sheets

ALIGNMENT LONG AXIS
θ
DUMMIFICATION LONG AXIS
638
626
L
S
Y
X
45°
630A
630B
630C
1030
1038
1026

ANGLED ELONGATED FEATURES FOR IMPROVED ALIGNMENT PROCESS INTEGRATION

CROSS-REFERENCE TO RELATED APPLICATIONS

This application is a divisional application of and claims priority to U.S. patent application Ser. No. 10/875,065, filed Jun. 23, 2004, now U.S. Pat. No. 7,315,087, the contents of which are incorporated herein by reference.

BACKGROUND

Integrated circuits are manufactured by forming a sequence of patterned layers. One process that may be used in the manufacture of integrated circuits is a chemical mechanical polishing (CMP) process. A chemical mechanical polishing process uses chemical and physical interactions between a polishing system and the surface of a substrate (e.g., a wafer) to improve the planarity of the surface.

One concern in a CMP process is that the wafer be polished uniformly across its surface, so that the desired degree of planarity is obtained. However, areas of the substrate that have more features generally polish at different rates than areas having fewer features.

In order to reduce polishing non-uniformity, special features called "dummification" features may be added. FIG. 1 shows a dummification lattice 110 including regularly arrayed square features 120. These features may provide more uniform feature density but may not be needed for the actual circuit design. Dummification therefore may improve the uniformity of a CMP process. For example, the CMP process may be improved by more closely matching the density of the dummification area with its surroundings. However, features 110 may prove problematic when used near alignment features.

Alignment features are generally sets of parallel lines that are used by the lithography system to determine the proper alignment to a previous layer, so that a new layer may be patterned with the correct spatial relationship to previously patterned layers. The alignment features are detected using either bright field (video) alignment, or dark field (diffraction) alignment. With either of these schemes, features positioned near alignment features (such as dummification features 110) can interact with the alignment light and prevent proper detection of the alignment features. As a result, dummification is generally omitted in regions near alignment features.

DESCRIPTION OF DRAWINGS

Like reference symbols in the various drawings indicate like elements.

DETAILED DESCRIPTION

Systems and techniques described herein may allow for improved integration of alignment and fabrication processes.

Figure 2:
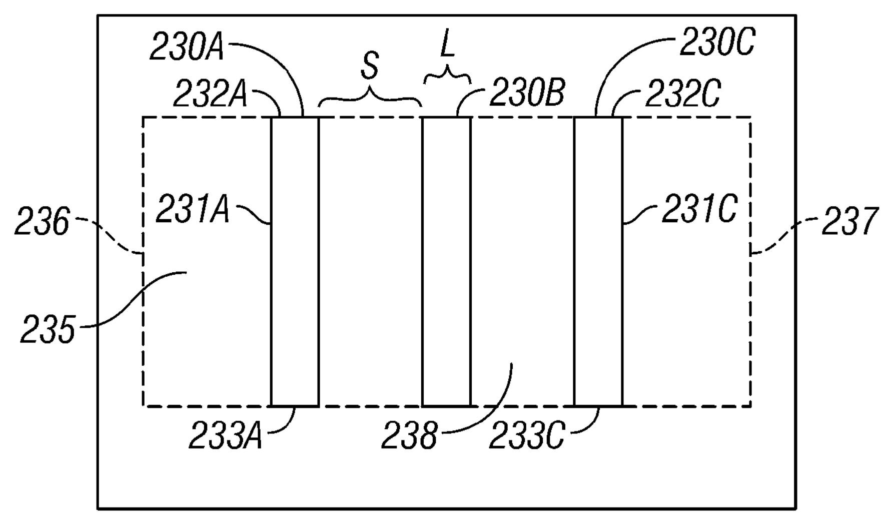
FIG. 2 shows alignment features for single axis alignment.

FIG. 2 shows an example of alignment features 230A to 230C (e.g., trenches) positioned near square dummification features 220. Alignment features 230A to 230C may be used to align a lithography system so that successive layers are patterned with the correct spatial relationship. Alignment features 230A to 230C have a line width L, which may be between about 0.1 micron to about 4 microns or more, and may be separated by a space having a width of about 4 microns to about 20 microns. Of course, many other line and space widths may be used.

In an alignment process, light is scanned along one or more measurement axes. Light interacts with features 230A to 230C and is detected in a detector. Other features near the alignment features may also interact with the alignment light, and may thus make detection of the alignment features more difficult.

Alignment features 230A to 230C may define an alignment region 238, which spans an area defined by outer edges 231A and 231C of features 230A and 230C, and further defined by a line extending from the top 232A of feature 230A to the top 232C of feature 230C and a line extending from the bottom 233A of feature 230A to the bottom 233C of feature 230C. Alignment region 238 extends to previous layers, as well as the layer in which the alignment features are formed. Features other than alignment features that are positioned within alignment region 238 (on the current layer, or in a previous layer) may interact with the alignment light and may therefore interfere with detection of the alignment features during an alignment process.

In some implementations, an extended alignment region 235 may be defined. Extended alignment region 235 is bordered on the top and bottom by the extension of the top and bottom border of alignment region 238, but is bordered on the left by a line 236 and on the right by a line 237. Line 236 may be a distance of between about S to about 2S from outer edge 231A, while line 237 may be a distance of about S to about 2S from outer edge 231C. Extended alignment region 235 also extends to previous layers. Features within extended alignment region 235 may also interact with alignment light and make it more difficult to detect the alignment features. For example, features within the portion of region 235 between line 236 and outer edge 231A may interfere with detection of the edge of an alignment mark.

Alignment may be accomplished using bright field (video) or dark field (diffraction) alignment. In bright field alignment, the alignment features are illuminated, and the alignment is determined using the detected image. In dark field alignment, coherent light (e.g., light from a laser source) is incident on the alignment features. A resulting diffraction pattern is detected and used to determine the alignment of the lithography system.

Alignment marks may be referred to as single axis or dual axis alignment marks. Single axis marks are used to align the lithography system in a single direction (e.g., the x or y direction). In order to align the system in both x and y (or equivalently, in two non-parallel directions, so that the two directions span the alignment plane), two single axis marks may be used. Dual axis alignment marks may be used to align the lithography system in two directions (e.g., the x and y directions, or other directions that span an alignment plane).

Figure 3A:
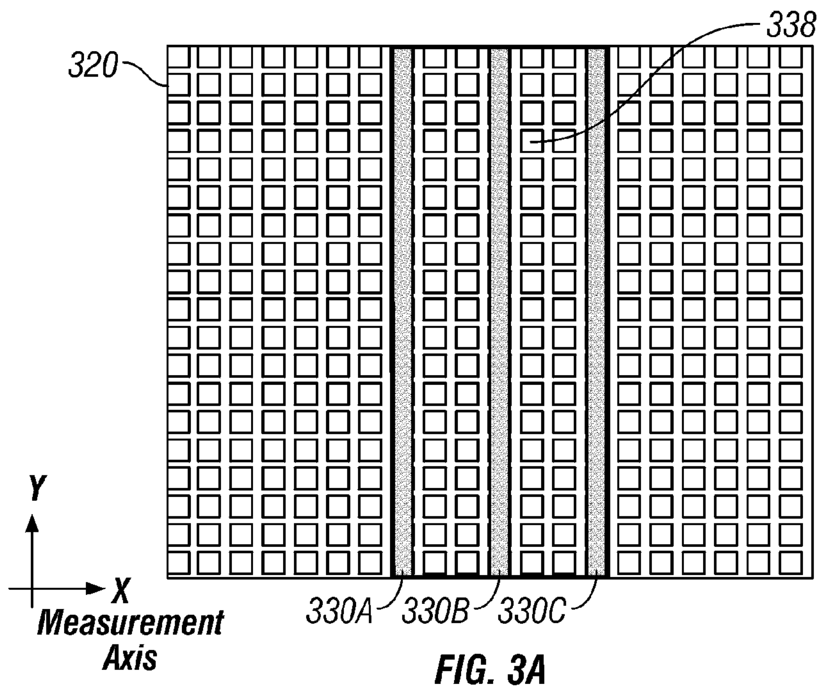
FIG. 3A shows an alignment region with alignment features such as those shown in FIG. 2, with square dummification features included in the alignment region.

FIG. 3A shows an example where elongated alignment features include single axis bright field alignment trenches 330A to 330C, and where dummification features 320 are used near alignment features. In FIG. 3A, the light areas denote lines or elevated regions, while the darker areas denote depressed regions such as holes or trenches. Note that the term "near" applies not only to dummification features on the same layer as the alignment features, but also dummification features in previous layers. A dummification feature is "near" the alignment features if it is positioned so that, during an alignment process, it interacts with alignment light and generates light that may be received by a detector configured to detect alignment features.

For example, dummification features 320 are included in alignment region 338 (as well as outside of region 338). Dummification features 320 may be on the same layer as alignment trenches 330A to 330C, or on a different (e.g., previous) layer. Dummification features 320 within alignment region 338 may cause contrast variation that interferes with the ability to detect alignment features.

Figure 3B:
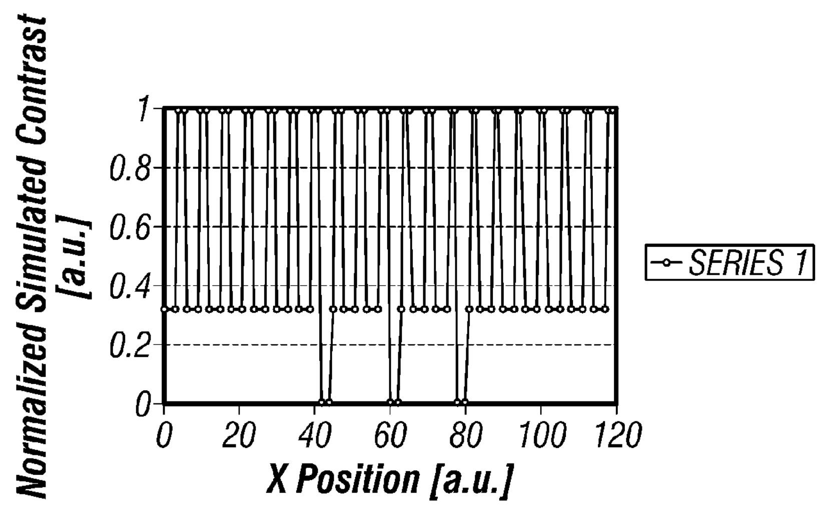
FIG. 3B shows a graph of normalized simulated contrast based on a configuration such as that shown in FIG. 3A.

An example of this is shown in FIG. 3B. FIG. 3B shows a bright field contrast signal simulation of three alignment trenches such as trenches 330A to 330C of FIG. 3A superimposed onto a 50% dense square dummification lattice. The signal generated by the dummification lattice may make it more difficult to detect the position of the alignment marks than an alignment area devoid of dummification.

Figure 4A:
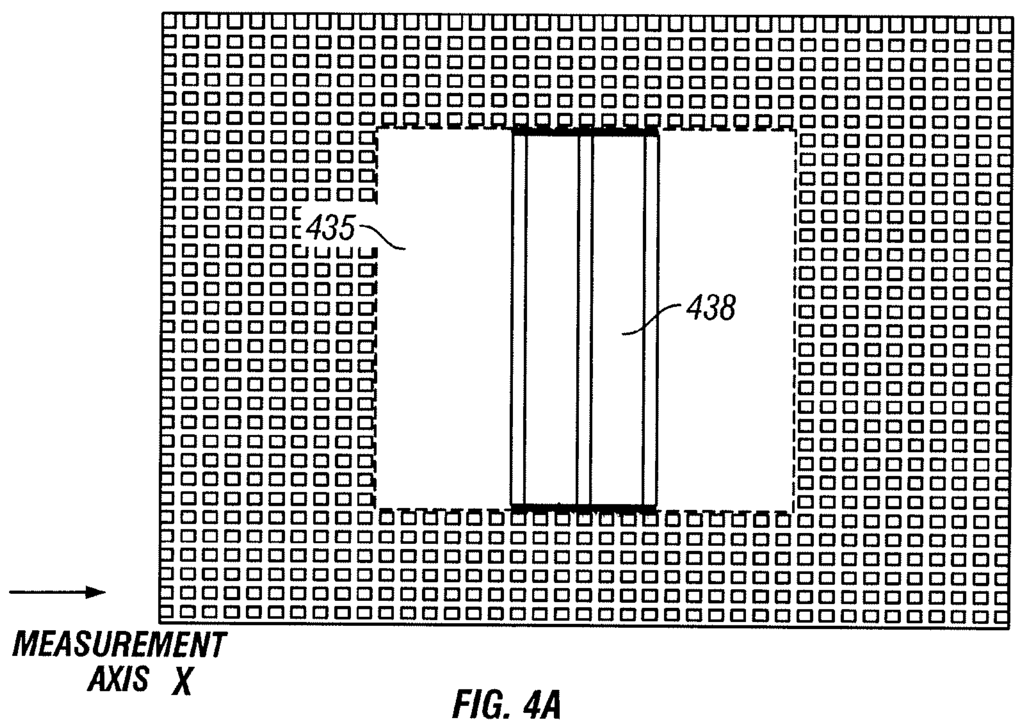
FIG. 4A shows alignment features in a region free of dummification, according to the prior art.
Figure 4B:
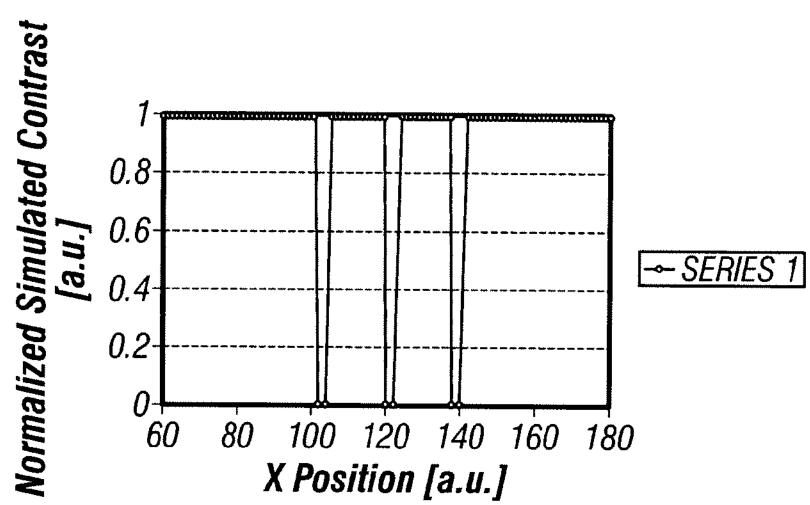
FIG. 4B shows a graph of normalized simulated contrast based on a configuration such as that shown in FIG. 4A.

FIGS. 4A and 4B show a scheme to combat this problem. FIG. 4A shows an extended alignment region 435 that is free from dummification features. Note that in the implementation of FIG. 4A, region 435 is larger than alignment region 438, defined similarly to alignment region 238 of FIG. 2. That is, dummification is omitted for a region larger than that defined by the bounds of the alignment features themselves. FIG. 4B shows a bright field contrast signal simulation obtained by integrating the image of FIG. 4A in the y direction. As FIG. 4B illustrates, the contribution from the dummification regions may be reduced or eliminated by omitting dummification regions from being near the alignment features.

Although this allows for easier detection of the alignment features, it may create process integration problems due to issues of process variations. For example, a CMP process may cause region 435 to be polished more than surrounding regions, leading to dishing and other defects in region 435, and at the interface between region 435 and surrounding portions of the wafer.

Figure 1:
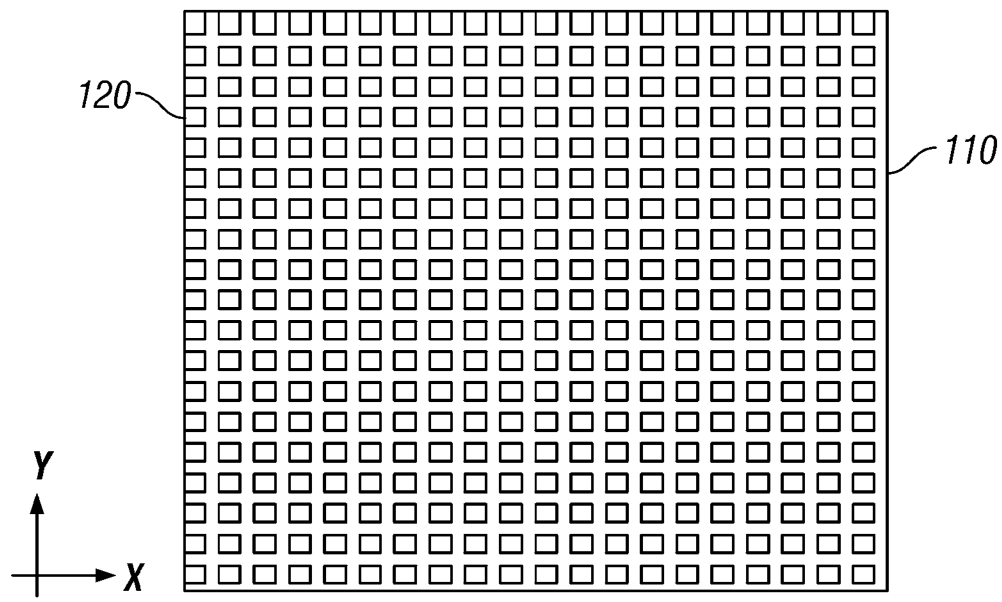
FIG. 1 is a lattice of dummification features.
Figure 5A:
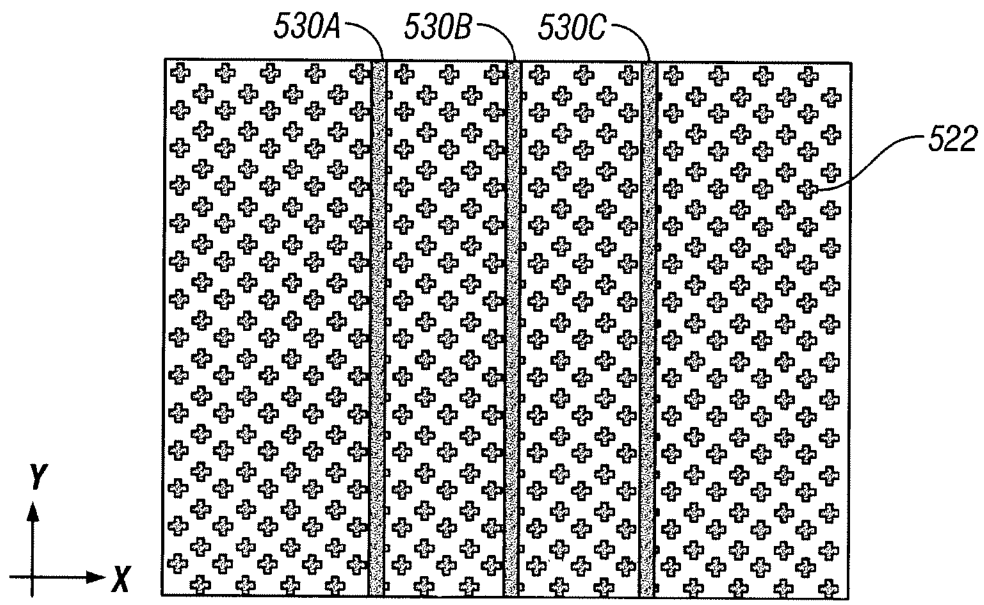
FIG. 5A shows hexagonal features that may provide improved integration of alignment and fabrication processes, according to an implementation.

FIG. 5A shows an implementation in which generally hexagonal features 522 may be used for dummification. Using hexagonal features 522 rather than square features such as features 110 of FIG. 1 may reduce the contrast signal generated by the dummification features rather than the alignment features such as trenches 530A, 530B, and 530C. FIG. 5A shows a hexagonal dummification pattern of 63% pattern density (shown in white) and 37% hole density (shown in gray). The measurement axes are the x and y axes, as indicated in FIG. 5A.

Figure 5B:
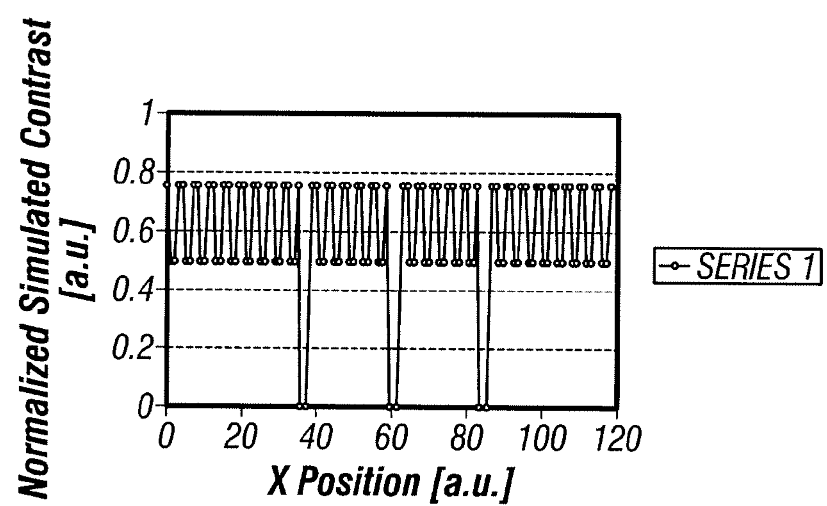
FIG. 5B shows a graph of normalized simulated contrast based on a configuration such as that shown in FIG. 5A.

FIG. 5B shows a graph of normalized simulated contrast based on the configuration of FIG. 5A. Comparing FIG. 5B to FIG. 3B, the generated alternating signal is smaller than that generated with a 50% dense square lattice. Thus, detection of an alignment feature may be easier using hexagonal features rather than square features. However, some alternating signal may be generated using hexagonal features. Further, the magnitude of the generated alternating signal may decrease as the hexagonal feature density increases. Therefore, incorporating hexagonal features in an alignment region may not be desirable in some applications.

Figure 6A:
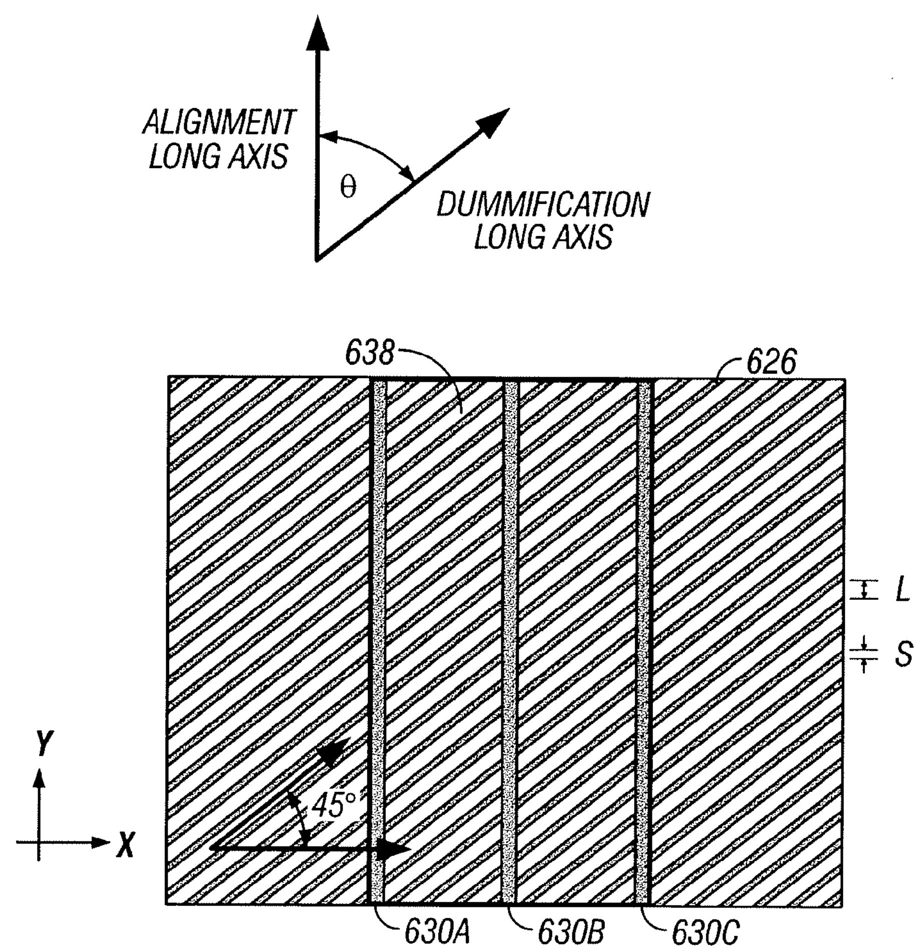
FIG. 6A shows an implementation including angled elongated features.

FIG. 6A shows an implementation of a plurality of angled elongated features 626 that may provide improved process integration without unduly compromising alignment feature detection. Note that although features 626 may be for dummification, the following description applies to other features that may be positioned near alignment features. However, in the following discussion, features 626 are referred to as dummification features, since they may be used for dummification.

Dummification features 626 are elongated: that is, their long dimension (e.g., length) is greater than their short dimension (e.g., width). For example, the length of elongated dummification features may be at least three times that of the width. Of course, the ratio of long dimension to short dimension may be greater, e.g., ten to one. Dummification features may be line-shaped; therefore, the dummification may thus be referred to as line/space dummification.

At least a portion of one of the plurality of elongated features may be included in an alignment region. That is, at least a portion of dummification features 626 may be included in alignment region such as region 638 of FIG. 6A, which is defined similarly to that of region 238 of FIG. 2. Alignment region 638 includes a plurality of elongated (e.g., line-shaped) alignment features such as features 630A to 630C having a long axis as shown. Alignment features 630A to 630C may be used to align a lithography system during a lithography process, or to determine an overlay parameter. The measurement axes are the x and y axes as shown in FIG. 6A.

The long axis of the alignment features and the long axis of the elongated features are angled with respect to each other at an angle θ. Angle θ is neither zero nor ninety degrees: that is, the long axis of the alignment features and the long axis of the elongated features are neither perpendicular to or parallel to each other.

As θ approaches zero or ninety degrees, the signal to noise ratio of the detected signal may decrease. For a minimum acceptable signal to noise ratio, the acceptable values of θ depend on the field of view and the line or space width. The minimum acceptable difference from zero or ninety degrees, $\Delta\theta_m$, for a particular desired signal to noise ratio S, a particular line width L, and a particular height of field of view H is given by: $\Delta\theta_m=\cos^{-1}(LS/H)$. Generally, relative angles of between about two degrees and about eighty eight degrees (where $\Delta\theta_m$ is about two degrees) may provide acceptable signal to noise ratio. However, for some implementations, an even larger range of angles may be used.

Figure 6B:
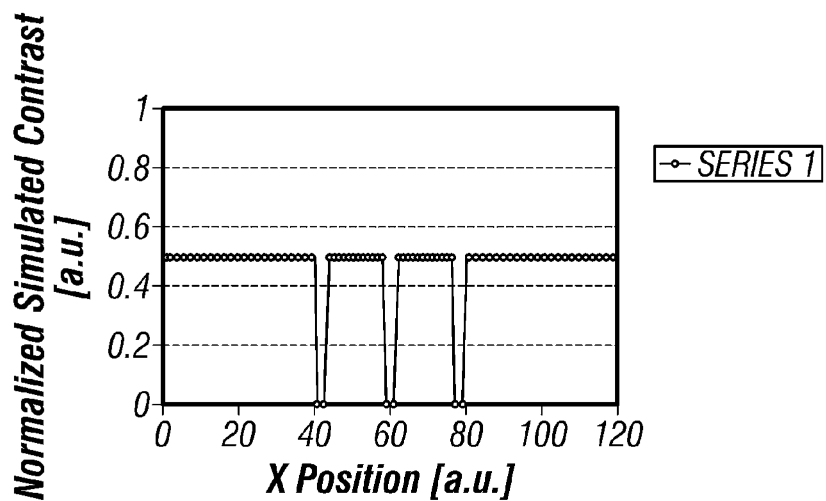
FIG. 6B shows a graph of normalized simulated contrast based on a configuration such as that shown in FIG. 6A.

FIG. 6B shows a simulated bright field contrast signal that may be obtained with alignment features 630A to 630C and angled dummification features 626 such as those shown in FIG. 6A. Rather than the intermittent signal generated with square dummification features, the background contrast signal generated from the dummification is generally constant. The signal may thus be amplified significantly without unduly compromising signal quality. This allows alignment features that generate relatively weak signals to be used.

Referring again to FIG. 6A, the width of one of the dummification features 626 shown is denoted as L, while the width of a particular space between two successive dummification features 626 is denoted as S. Although FIG. 6A shows the line widths as all being equal, they need not be (e.g., for i lines, different values of $L_i$ may be used for different lines). Similarly, the widths of the spaces may vary. Although the widths of the lines and spaces may vary, the line density is generally selected to provide a desired feature density. For example, the line density may be selected so that the overall feature density near the alignment features more closely matches the surrounding pattern density of the layer is sufficient to obtain a desired level of planarity.

Note that the feature density near the alignment features and the pattern density are both generally discussed in terms of a particular window size. That is, the feature density is the percentage of the window that is spanned by features rather than space between features. The window size is selected to be large enough so that the determined density provides an accurate reflection of the overall density, while being small enough to reflect spatial variations in feature density.

Figure 7A:
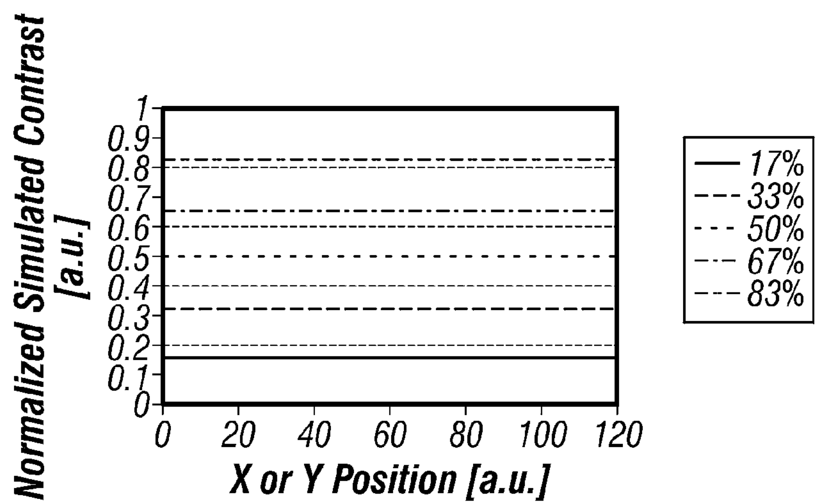
FIG. 7A shows simulated bright field contrast signals for dummification of different densities.

FIG. 7A shows a simulated bright field contrast signal that may be obtained with angled elongated features such as features 626 of FIG. 6A with different line/space densities (17, 33, 50, 67, and 83% line densities), in the absence of alignment features. FIG. 7A shows that the signal generated by the angled elongated features during an alignment process is a generally constant signal. The signal may thus be amplified without significantly eroding the ability to detect the alignment features.

Figure 7B:
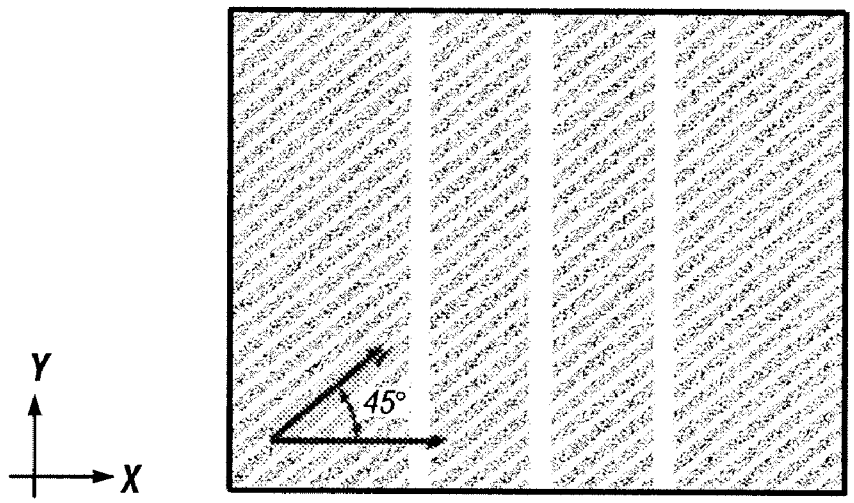
FIGS. 7B and 7C show two implementations of dummification features of different densities incorporated in an alignment region.
Figure 7C:
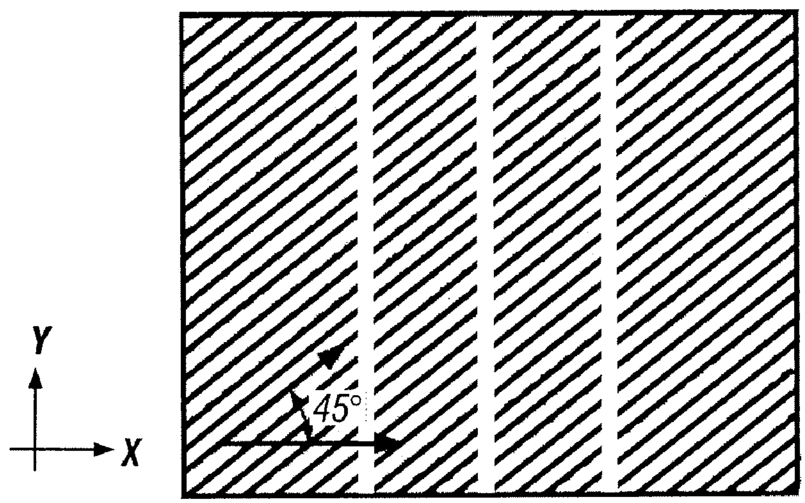
Figure 7D:
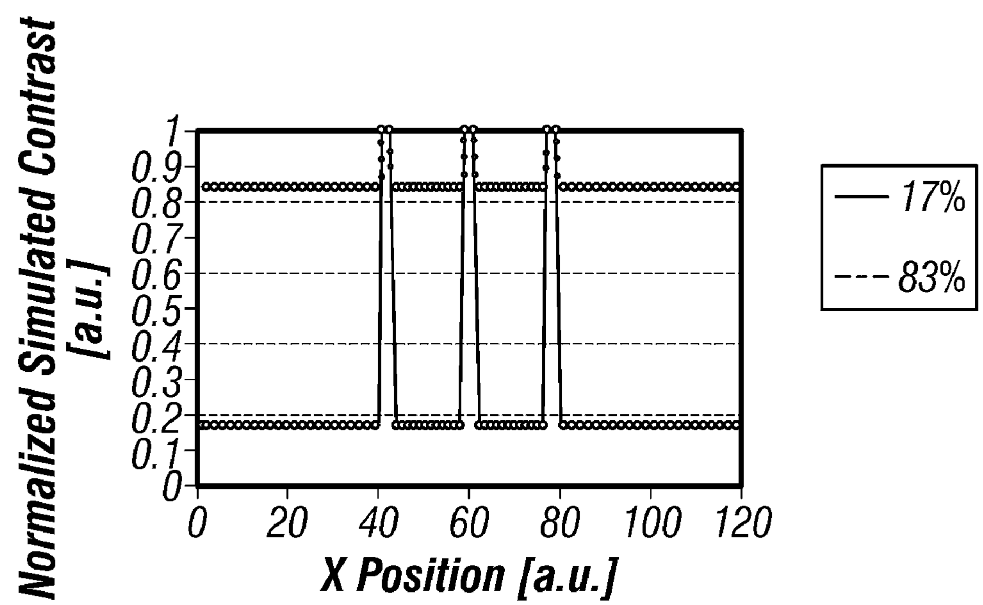
FIG. 7D shows simulated bright field contrast signals for the configurations of FIGS. 7B and 7C.

FIG. 7B shows an implementation with 17% line density, while FIG. 7C shows an implementation with 83% line density. FIG. 7D shows a simulated bright field contrast signal for the implementations of FIGS. 7C and 7D. Although the normalized signal amplitude for the alignment features decreases with increasing line density, because the contribution from the dummification is generally constant, the signal may be amplified to increase the signal level. Thus, the ability to detect the alignment features is not unduly compromised.

Figure 8A:
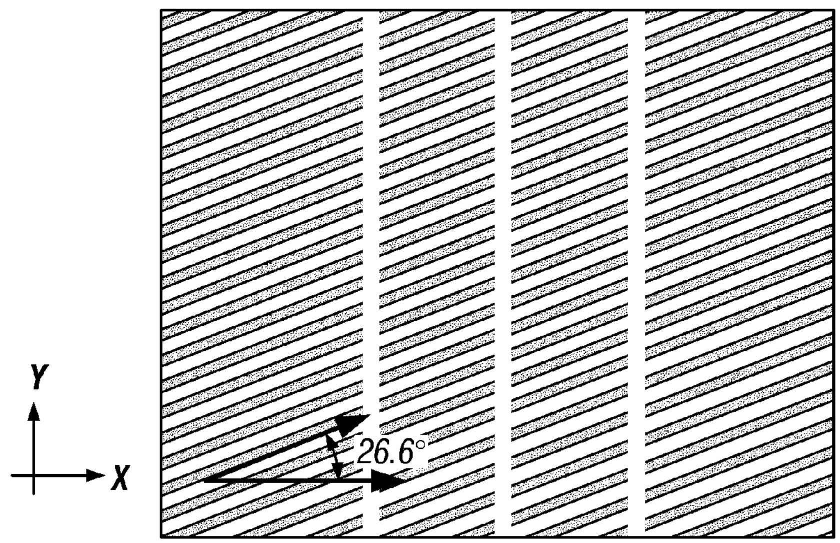
FIGS. 8A and 8B show two implementations of dummification features at different relative angles to alignment features.
Figure 8B:
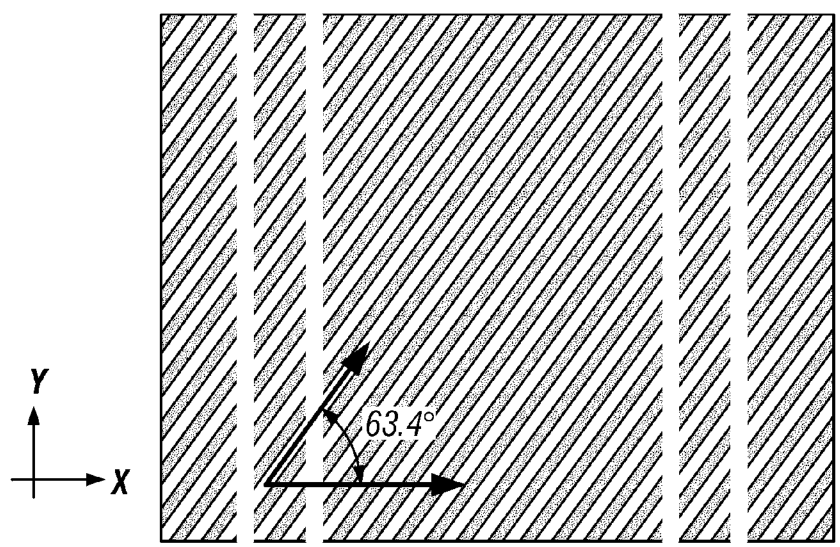
Figure 8C:
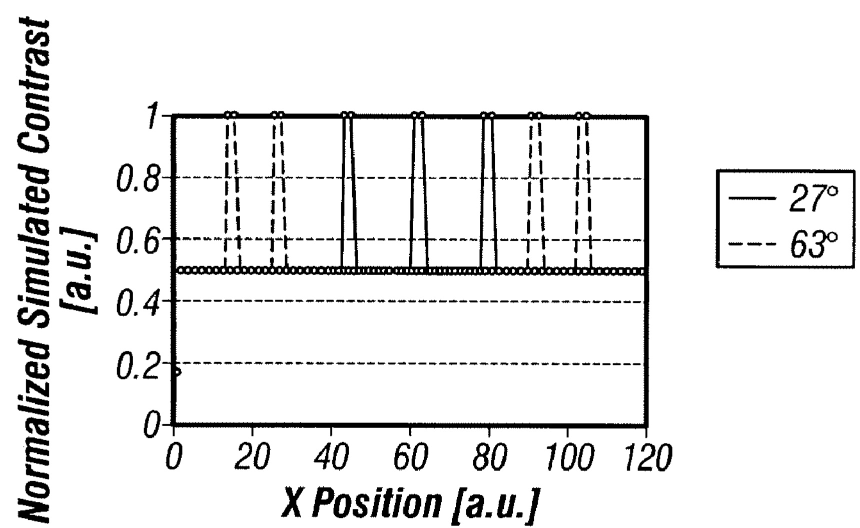
FIG. 8C shows simulated bright field contrast signals for the configurations of FIGS. 8A and 8B.

Different relative angles may be used. FIGS. 8A and 8B show implementations where the relative angle between the long axis of the alignment features and the long axis of the elongated features are 63.4 and 26.6 degrees, respectively. FIG. 8C shows that both implementations produce substantially similar contrast signals due to the elongated features. Further, the normalized signal amplitude for the alignment features is the same, although the x positions are shifted.

Figure 9:
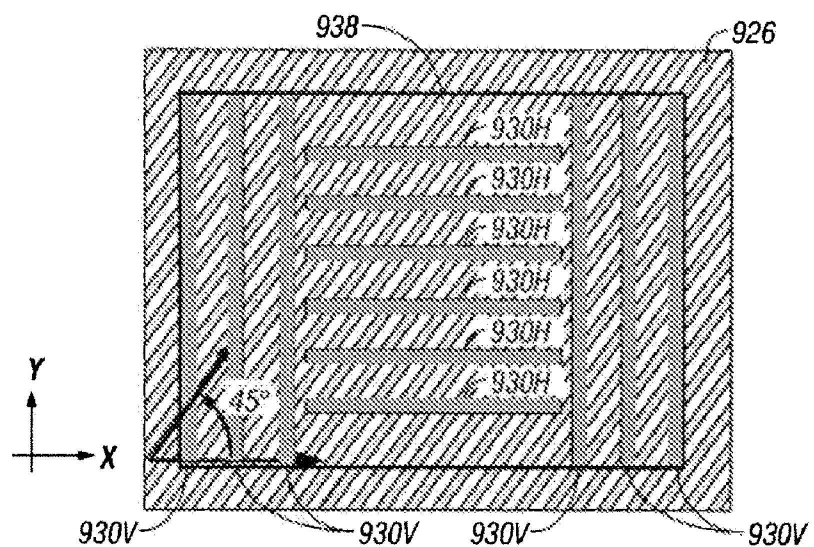
FIG. 9 shows an implementation of a dual axis alignment mark.

In some implementations, dual axis marks may be used. Dual axis marks generally allow determination of the alignment in two axes spanning an alignment plane using the same mark. FIG. 9 shows an example of a Nikon dual axis x/y mark having angled dummification features 926. FIG. 9 includes a plurality of vertical alignment features 930V and a plurality of horizontal alignment features 930H. An alignment region 938 extends from a first outer edge of, for example, alignment features 930V, to a second outer edge of alignment features 930V. Alignment region 938 extends from the current layer including the alignment features downward to one or more previous layers. Angled elongated features 926 are at an angle θ with respect to features 930V, and at an angle (90-θ) with respect to features 930H. Angle θ is neither zero nor ninety degrees; that is, the long axis of the angled elongated features is neither parallel to nor perpendicular to the long axis of features 930V or 930H. Note that the term "parallel" means that, the vector cross product is substantially zero, while the term "perpendicular" means that the vector dot product is substantially zero. As discussed above, the features need not be in the same plane.

Another type of alignment feature is an overlay feature. The objective of overlay measurements is to determine how well successive layers were aligned. In addition to aligning a lithography system, angled dummification features such as features 626 of FIG. 6A may be used for overlay measurements. Overlay measurements are generally obtained using a registration tool, such as a registration tool manufactured by KLA-Tencor.

Figure 10:
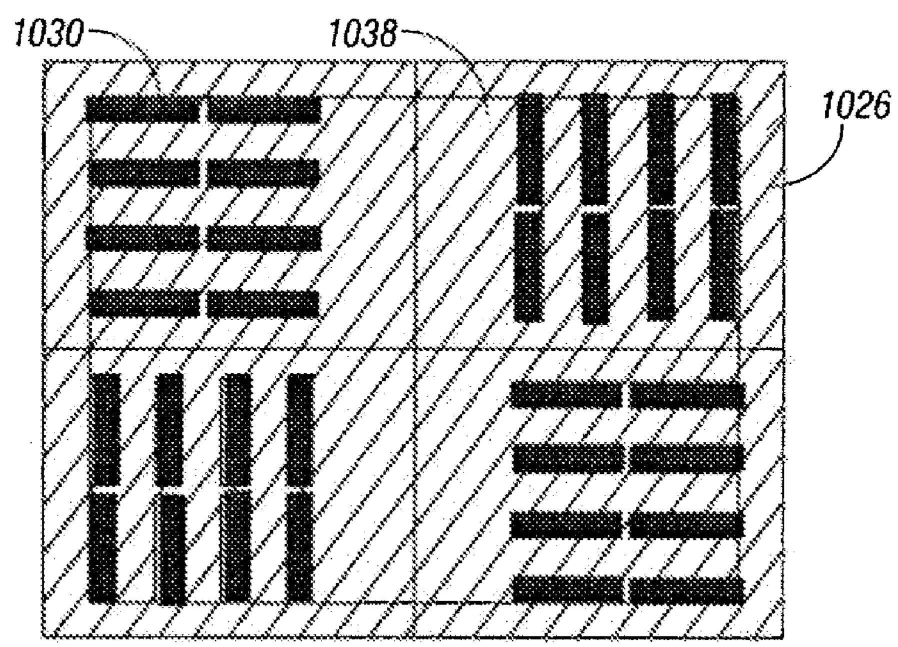
FIG. 10 shows a zoned overlay mark with angled features included at least partially in an alignment region.

FIG. 10 illustrates an implementation in an overlay mark, such as a KLA-Tencor Advanced Imaging Metrology (AIM) overlay mark, is used. The overlay mark includes a plurality of alignment features 1030 in an alignment region 1038, and may be patterned in a different layer above the layer including angled elongated features 1026.

Angled elongated features may be used with other types of alignment features. For example, angled elongated features may be used with dual axis zoned alignment schemes.

Like features 626 of FIG. 6A, features 1026 are angled. Non-angled features may be used for dummification with single axis marks, and may be used with zoned marks like the overlay mark shown in FIG. 10. However, using angled features with a zoned overlay mark such as shown in FIG. 10, or with a zoned alignment mark, may eliminate or reduce spurious signals generated at zone boundaries that may occur using non-angled features.

Alignment features such as those described above may be used as follows. For an implementation in which the alignment features are used to align a lithography system, light may be transmitted to one or more elongated alignment features (e.g., a plurality of line-shaped alignment features), where angled elongated dummification features are positioned near the alignment features. The light interacts with both the alignment features and the dummification features. However, because of the shape and relative orientation of the alignment and dummification features, the received light corresponding to the dummification features is a generally constant background signal.

The received light may then be analyzed to determine an alignment state of the lithography system. The position error of a portion of the lithography system relative to the alignment marks on the substrate may be determined and corrected by the lithography system during the exposure of the wafer to within acceptable limits.

For an implementation in which the alignment features are used to determine an overlay, light may be transmitted to one or more elongated alignment features (e.g., elongated alignment features included in an overlay mark), where angled elongated dummification features are positioned near the alignment features. Again, the light interacts with both the alignment features and the dummification features, but the contribution from the dummification features is generally constant. The received light may be analyzed and the overlay may be determined.

A number of implementations have been described. Nevertheless, it will be understood that various modifications may be made without departing from the spirit and scope of the invention. For example, some variations in the angle and shape of the dummification features may be used. In general, there will be a desired signal to noise ratio, and some noise due to dummification features may be tolerated. Further, there may be a range of acceptable line/space densities for a particular layer design.

Also, while the above has described these techniques for use with the special "dummification" features, it should be understood that these techniques can be used with any semiconductor feature. Additionally, although the above description discussed dummification and alignment features patterned on a wafer, they may be incorporated into one or more semiconductor parts, such as masks, reticles, substrates, and the like. In some implementations, angled dummification features may be used with dark field alignment schemes. Accordingly, other implementations are within the scope of the following claims.

What is claimed is:

1. A method comprising:

forming a plurality of elongate features on a semiconductor part, the elongate features each having an associated long dimension substantially along a long axis and an associated short dimension, the associated long dimension greater than the associated short dimension; and forming a plurality of alignment features on the semiconductor part, the plurality of alignment features aligned substantially along a long axis, the plurality of alignment features to define an alignment region, the alignment region bordered by a first outer alignment feature and a second outer alignment feature and extending vertically, wherein a portion of at least one of the plurality of elongate features is included in the alignment region, the long axis of the plurality of elongate features and the long axis of the alignment features are neither parallel nor perpendicular to one another, and the elongate features are dimensioned to interact with electromagnetic radiation in a manner that would interfere with detection of the alignment features were the elongate features aligned parallel to the first axis.

2. The method of claim 1, wherein the elongate features comprise dummification features formed on a substrate.

3. The method of claim 1, wherein one or more of the plurality of elongate features is positioned between a first alignment feature and a second alignment feature.

4. The method of claim 1, wherein:

the plurality of alignment features are formed in a current layer, and the one or more of the plurality of elongate features are formed in a previous layer.

5. The method of claim 1, wherein the elongate features comprise line-shaped features.

6. The method of claim 1, wherein the alignment features are dimensioned and positioned for the determination of an alignment parameter.

7. The method of claim 6, wherein a dual axis alignment mark comprises the alignment features.

8. The method of claim 1, wherein a single axis alignment mark comprises the alignment features.

9. The method of claim 1, wherein the alignment features are dimensioned and positioned for the determination of an overlay parameter.

10. The method of claim 1, wherein the semiconductor part comprises one of a mask, a reticle, and a substrate.

11. The method of claim 1, wherein:

the long axis of the plurality of alignment features is at an angle theta with respect to the long axis of the plurality of elongate features, and the angle theta is in the range from about two degrees to about eighty eight degrees.

12. The method of claim 1, wherein the plurality of alignment features have an average line width L, the long axis of the plurality of alignment features is at an angle theta with respect to the long axis of the plurality of elongate features, and for a particular signal to noise ration S, a particular field of view height H, the angle theta is between degrees plus Δθm and ninety degrees minus Δθm, where Δθm=cos−1(LS/H).

13. A method of aligning a semiconductor part, comprising:

transmitting electromagnetic radiation to an alignment region defined by a collection of alignment features each having a long dimension along a first axis and a short dimension, wherein the alignment region includes a collection of elongate features each having an associated long dimension along a long axis and an associated short dimension, wherein the long axis of the elongate features and the first axis of the alignment features are neither parallel nor perpendicular to one another;

receiving electromagnetic radiation that has interacted with the collection of alignment features and electromagnetic radiation that has interacted with the collection of elongate features; and determining an alignment parameter based on the received electromagnetic radiation.

14. The method of claim 13, wherein the received electromagnetic radiation has been reflected from at least one of the collection of alignment features.

15. The method of claim 13, wherein the received electromagnetic radiation comprises diffracted electromagnetic radiation that has been scattered by at least one of the collection of alignment features.

16. The method of claim 15, wherein the diffracted electromagnetic radiation comprises at least one non-zeroth order diffracted electromagnetic radiation.

17. The method of claim 13, wherein:

the first axis and the long axis of the collection of elongate features are angled with respect to each other at an angle theta, and the angle theta is between about two degrees and about eighty eight degrees.

18. The method of claim 17, wherein the collection of elongate features are formed in a lower layer of an integrated circuit than the collection of alignment features.

19. The method of claim 13, wherein the alignment parameter is indicative of an alignment of a lithography system.

20. The method of claim 13, wherein the alignment parameter is indicative of an overlay between a first layer and a second layer of a circuit structure.

21. The method of claim 13, wherein the elongate features include dummification features.

22. The method of claim 13, wherein the alignment features are included in at least one of an alignment mark and an overlay structure.

23. The method of claim 13, wherein:

the plurality of alignment features have an average line width L;

the first axis is at an angle theta with respect to the long axis of the plurality of elongate features; and for a particular signal to noise ration S and a particular field of view height H, the angle theta is between degrees plus $\Delta\theta m$ and ninety degrees minus $\Delta\theta m$, where $\Delta\theta m = \cos - 1(LS/H)$.

24. A method for fabricating a device on a substrate, comprising:

forming, on the substrate, a collection of alignment features aligned along a first axis and a collection of elongate dummification features positioned in an alignment region defined by the plurality of alignment features, the elongate features having a long axis, the long axis neither parallel nor perpendicular to the first axis;

polishing a layer of the substrate that includes the dummification features; and aligning the substrate based on an interaction of an electromagnetic radiation with the alignment features, wherein the elongate features are dimensioned to interact with electromagnetic radiation in a manner that would interfere with detection of the plurality of alignment features were the elongate features aligned parallel to the first axis.

25. The method of claim 24, wherein forming the collection of alignment features and the collection of elongate dummification features comprises forming the collection of alignment features and the collection of elongate dummification features in the layer of the substrate.

26. The method of claim 24, wherein the collection of alignment features comprises a collection of parallel lines.

27. The method of claim 26, wherein the parallel lines are unconnected to other features.

* * * * *